United States Patent [19]

Denyer

[11] Patent Number: 5,345,266
[45] Date of Patent: Sep. 6, 1994

[54] MATRIX ARRAY IMAGE SENSOR CHIP

[75] Inventor: Peter B. Denyer, Edinburgh, Scotland

[73] Assignee: VLSI Vision Limited, Edinburgh, Scotland

[21] Appl. No.: 842,107

[22] Filed: Apr. 23, 1992

[30] Foreign Application Priority Data

Oct. 23, 1989 [GB] United Kingdom ............... 8921538
Apr. 26, 1990 [GB] United Kingdom ............... 9009332

[51] Int. Cl.$^5$ ............................................. H04N 3/14
[52] U.S. Cl. ........................................ 348/300; 348/302; 348/304
[58] Field of Search ............... 358/213.23, 213.29, 358/212, 213.27, 213.11

[56] References Cited

U.S. PATENT DOCUMENTS

| | | | |
|---|---|---|---|
| 4,155,006 | 5/1979 | Sato et al. | 358/213.27 X |
| 4,233,632 | 11/1980 | Akiyama | 358/212 |
| 4,266,237 | 5/1981 | Hendrickson | 357/41 |
| 4,267,469 | 5/1981 | Ohba | 307/311 |
| 4,310,477 | 11/1981 | Takemoto | 358/166 |
| 4,366,455 | 12/1982 | Berger | 333/165 |
| 4,392,158 | 7/1983 | Aoki | 358/212 |
| 4,407,010 | 9/1983 | Baji | 250/211 J |
| 4,467,400 | 8/1984 | Stopper | 361/403 |
| 4,479,088 | 10/1984 | Stopper | 324/73 R |
| 4,486,705 | 12/1984 | Stopper | 324/73 R |
| 4,575,638 | 3/1986 | Okumura | 358/213.29 X |
| 4,651,016 | 3/1987 | Hirao | 250/578 |
| 4,656,503 | 4/1987 | Hynecek | 358/44 |
| 4,665,422 | 5/1987 | Hirao | 357/30 |
| 4,677,490 | 6/1987 | Levine | 358/213.26 |
| 4,680,476 | 7/1987 | Berger | 250/578 |
| 4,690,606 | 9/1987 | Ross | 414/495 |
| 4,876,534 | 10/1989 | Mead et al. | 358/212 X |
| 4,975,932 | 12/1990 | Matsushima et al. | 358/213.19 X |

FOREIGN PATENT DOCUMENTS

WO83/03730 4/1983 .

Primary Examiner—Michael T. Razavi
Assistant Examiner—Wendy R. Greening
Attorney, Agent, or Firm—Bell, Seltzer, Park & Gibson

[57] ABSTRACT

A matrix array image sensor integrated circuit chip is provided including horizontal and vertical scanning means with the sensor cells within columns of the array being associated with an analogue charge sense amplifier. The analogue charge sense amplifier includes a first amplifier in the form of an inverting charge integrator which provides a preliminary detection of the charge accumulated in the sensing cell by integrating the charge to produce a voltage which is capacitively stored in a voltage storage means. The sensing cell may then be reset by control logic while it is isolated from the stored voltage which is in turn selectively sampled using a switch to read out through a second amplifier stage to be provided as an output from the integrated circuit chip. A method for operation of the device in processing an image read cycle is also provided.

20 Claims, 2 Drawing Sheets

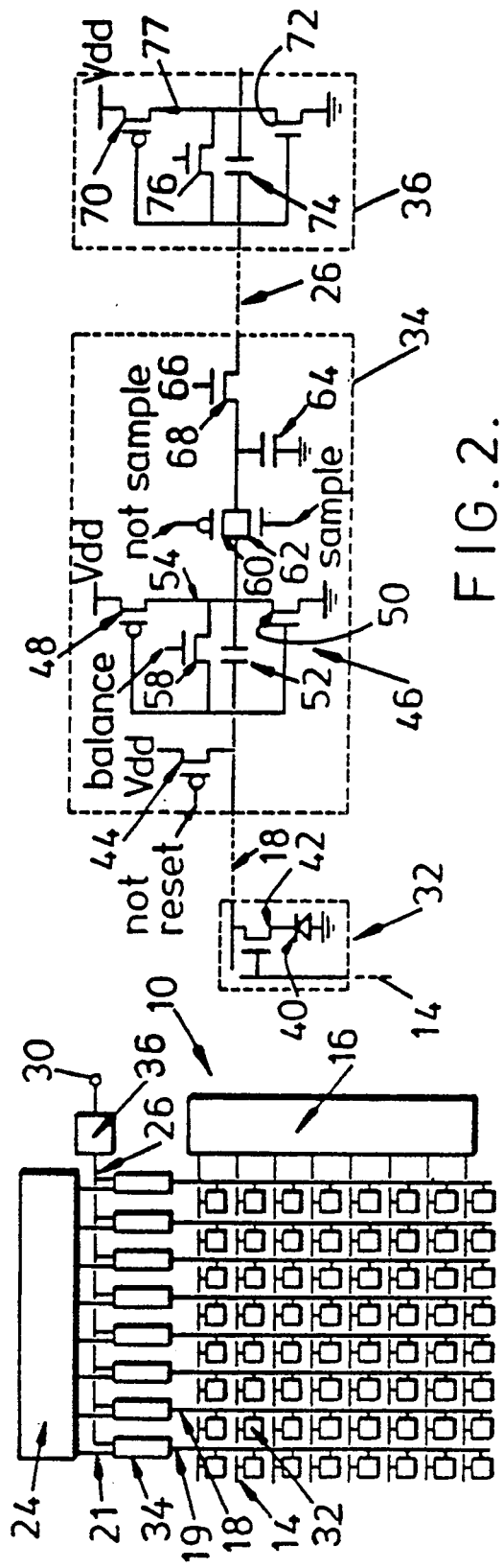
FIG. 2.
FIG. 1.
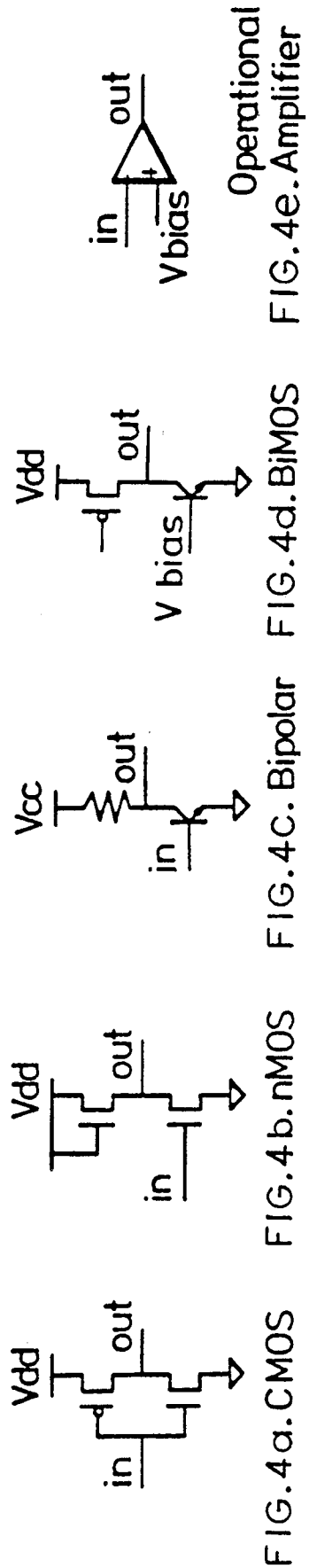
FIG. 4a. CMOS FIG. 4b. nMOS FIG. 4c. Bipolar FIG. 4d. BiMOS FIG. 4e. Operational Amplifier

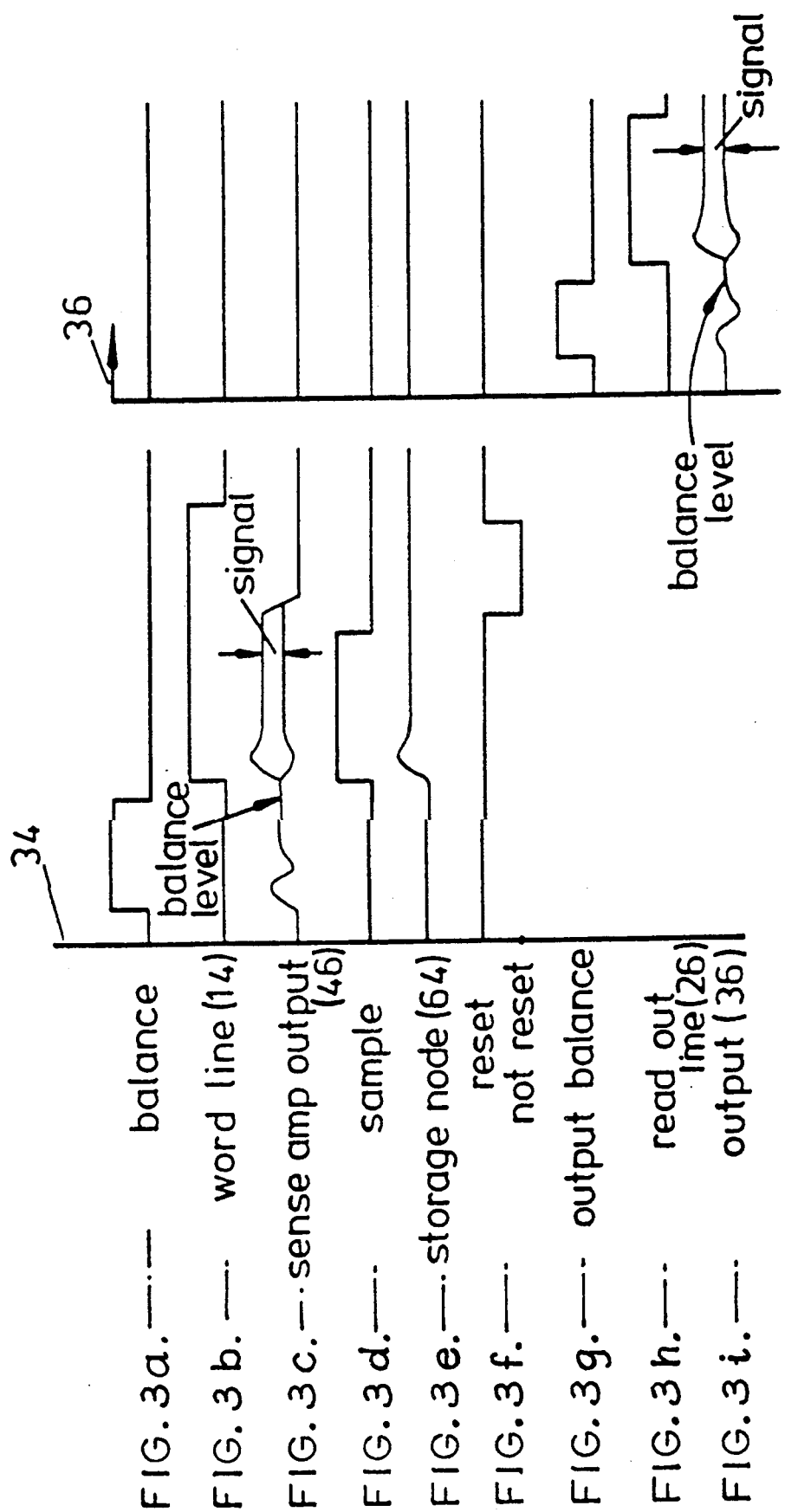

MATRIX ARRAY IMAGE SENSOR CHIP

FIELD OF THE INVENTION

The present invention relates to the design of integrated circuits for realising array image sensors in standard integrated circuit technology.

BACKGROUND OF THE INVENTION

Solid state image sensors are presently realised in two common forms:

Charge Coupled Devices and MOS diode arrays. Both forms require specialised fabrication processes to suit them for image sensing and both forms also require substantial electronic circuits external to the sensing chip in order to drive the arrays and to process the output signal. A complete sensor subsystem therefore typically requires an assembly of many components (often between 10 and 100 components to realise a simple camera function) with consequent implications of high production costs, power consumption and physical size.

Diode array sensors are commonly based on a two dimensional array of photodiodes implemented as the reverse-biased semiconductor junctions of the type normally used to form the source and drain regions of MOS transistors. A high reverse bias is applied (typically of the order of 3 volts or greater) and the diode then is electrically isolated and exposed to light or other radiation to be detected. Incident radiation increases the reverse-bias leakage current to the diode and this current is effectively integrated on the reverse-bias capacitance of the isolated junction causing a reduction in the reverse-bias potential. The use of such techniques for conversion of radiation to electronic charge and potential is well known and practiced. In particular this technique is used in MOS diode array type sensors. In these sensors a single MOS transistor controls access to the diode for the purpose of writing to the cell (that is, resetting to a high reverse-bias) and reading from it by connecting the diode to a bit-line (i.e. sense line or column line) and thence ultimately to charge-sensing circuits which convert the charge stored within the cell to an output voltage.

Typically the array is accessed in scan-line format whereby the array is read as consecutive rows, and within each row by consecutive pixels. This process is also commonly practiced and involves enabling each row of cells by a "word-line" which is connected in common to the access transistor gates of all cells in the row. Digital circuitry is used to generate and to drive the necessary pattern of word-line signals. Normally this circuitry may take the form of a shift register. As each word-line is enabled, one row of cells is connected to bit-lines and thereby to peripheral circuitry at the top of the array. Further digital circuitry produces enabling signals that control analogue switching or sense circuitry to enable the signals on consecutive bit-lines to be connected to the output. Again the shift-register function may be used to realise the digital circuitry.

In order to realise a compact array it is desirable to maintain a small cell pitch, typically 20 microns or less horizontally and vertically, although the cell aspect ratio need not be square. This small pitch poses significant design problems in realising the vertical and horizontal scan register circuit and it is also a serious constraint on the realisation of analogue sense and switching circuitry located at the top of each bit line.

For these reasons it has been conventional practice for MOS array sensors to include only a simple analogue switch (for example, a MOS pass-transistor) to enable the bit-line to be connected to a common read out line and thence to a common charge sense amplifier. The requirements of the sense amplifier in the terms of sensitivity, dynamic range and speed are quite formidable considering the small charge originally resident at the cell site within the array, that the amplifier is required to sense. The design of such an amplifier can therefore become quite sophisticated and the present common practice is to realise such an amplifier in external circuitry.

Therefore this sensing amplifier and the tenuous connection to it becomes a critical factor in limiting the performance of the sensor system.

SUMMARY OF THE INVENTION

An object of the present invention is to overcome at least one of the aforementioned disadvantages.

This is achieved by including an analogue charge sense amplifier within the amplifying circuit at the top of each bit-line. The analogue charge sensor amplifier includes two basic amplification stages. A first amplifier stage performs a preliminary detection of the charge accumulated in the cell and converts this charge to a voltage which is capacitively stored prior to read out. The voltages are read out to a second amplifier stage which produces the required output.

According to one aspect of the invention there is provided an integrated circuit for use as an image array sensor, said integrated circuit comprising, a two-dimensional array of sensing cells, each sensing cell having a photodiode and a transistor for reading from and writing to the photodiode, horizontal and vertical scan means coupled to each cell in the array for scanning each cell row and cell column of the array, analogue switch means connected between each column and the horizontal scan means for receiving image data from said cells, each of said analogue switch means being also connected by a common conductor to a sensing amplifier forming the output of the integrated circuit said integrated circuit being characterised in that:

each of said analogue switch means includes first charge sensing amplifier means which provides a preliminary detection of charge created on each cell in response to radiation impinging thereon by converting the detected charge to a voltage using a first charge integrating circuit and capacitively storing the voltage in storage means, in the form of a charge corresponding to the cell charge, that second charge sensing amplifier means are selectively coupled via a switch to said storage means for providing an output signal to the off-circuit read device, said output signal being a voltage proportional to the charge in said first storage means.

Conveniently, the cell being "read" is reset using a signal from the vertical scan means and signals generated off-circuit of the array whilst being isolated from the signal stored in the storage means. Conveniently the second charge sensing amplifier means is a second charge integrating circuit.

Preferably also the first charge integrating circuit comprises an inverter consisting of two transistors arranged to provide negative gain and at least one capacitor located between input and output terminals of the inverter to provide charge integration via negative feedback to provide a voltage at an output of the inverter. Alternatively, the invertor consists of one transistor and one resistor or an operational amplifier and at least one capacitor.

The integrated circuit may be fabricated using a technology selected from the group consisting of CMOS, PMOS, NMOS, Bipolar, BiMOS, BiCMOS or amorphous silicon technologies.

According to another aspect of the invention as provided a method of detecting radiation incident upon an image sensor fabricated using integrated circuit technology in which the integrated circuit comprises a two dimensional array of image sensing cells, each image sensing cell having a photodiode and a transistor for reading to and writing from the photodiode, horizontal and vertical scan means coupled to each cell in the array for scanning each cell row and cell column in the array, and analogue switch means connected between each column and said horizontal scan means for receiving image data from each of said cells, each of said analogue switch means being also connected by a conductor to a sensing amplifier having its output connected to an external read-device for reading image signals from said sensing amplifier, said method being characterised by the steps of:

modifying each analogue switch to incorporate a charge sense amplifier capable of reading a specific cell by generating a voltage to balance charge in the cell created in response to incident radiation, storing the voltage capacitively in the charge sense amplifier in the form of a charge corresponding to the cell charge, and reading out the capacitively stored information in the charge sense amplifier to an output amplifier.

Conveniently when the voltage is capacitively stored in said sense amplifier, the cell is isolated from the storage means using a switch which is actuated in response to off-circuit signals; and during the period when the cell is isolated the cell is reset by a combination of signals from the horizontal scan line and off-circuit signals.

These and other aspects of the present invention will become apparent from the following description when taken in combination with the accompanying drawings.

BRIEF DESCRIPTION OF THE DRAWINGS

FIG. 1 depicts the architecture of an array image sensor incorporating an analogue charge sense amplifier in accordance with an embodiment of the present invention;

FIG. 2 depicts a circuit diagram of a complete analogue circuit for each charge amplifier incorporating a charge sense amplifier in accordance with an embodiment of the present invention;

FIGS. 3a–3i depict timing waveforms for the operation of the circuitry shown in FIG. 2 of the drawings, and FIGS. 4a, b, c and d are circuit diagrams of column sense amplifiers for use in CMOS, nMOS, Bipolar and BiMOS technologies respectively and FIG. 4e is a diagram of the operational amplifier used.

DETAILED DESCRIPTION OF THE INVENTION

Reference is first made to FIG. 1 of the drawings which depicts an array image sensor generally indicated by reference 10 which consists of an array of pixels 32 laid out in generally rectangular format in rows and columns. Each pixel 32 in a row is connected to a common horizontal line called a word-line 14 and each word line is connected to digital circuitry 16 which is used to generate and drive the necessary pattern of word line signals. This circuitry 16 generally takes the form of a shift register. Each vertical column of pixels is connected to a common conductor known as a bit-line 18 which is connected to a respective analogue switch sense amplifier circuit 34. In the case of the present embodiment, as will be later described in detail, each amplifier 34 includes the novel charge sense amplifier circuit. Amplifiers 34 are identical and only one will be described in detail for clarity although it will be understood that the description is applicable to all other such amplifiers.

The amplifier 34 has two inputs 19,21 and one output 22. The input 21 coupled to a common digital circuit 24 which produces enabling signals that control the analogue or sense amplifier circuits 34 to enable the signals on consecutive bit-lines to be connected to the output of the array image sensor 10. Conveniently the digital circuitry 24 is realised by a shift register. The output of each amplifier 34 is connected to a common conductor 26 which functions as a common read out line and which is connected to a sense amplifier 36. The amplifier 36 has an output 30 from which the output of the integrated circuit is taken and the operation of this will be later described in detail with reference to FIGS. 2 and 3 of the drawings.

Reference is now made to FIG. 2 of the drawings which is circuit diagram of the analogue circuit chain including an image integration cell generally indicated by reference numeral 32, a column sense amplifier generally indicated by reference numeral 34 and an output amplifier generally indicated by reference numeral 36. The image integration cell 32 is a pixel 32 which is connected to a word line 14 and to a bit line 18. Each pixel or image integration cell 32 consists of a diode 40 coupled to a transistor 42.

The column sense amplifier 34 consists of a transistor 44 and an invertor circuit generally indicated by reference numeral 46. The design of stage 46 is important to the success of the circuit in this embodiment and it is centered on a CMOS invertor realised by transistors 48 and 50 which provides a negative gain of the order of −100. A capacitor 52 is connected between the bit-line 18 and the output 54 of the invertor circuit 46 which provides charge integration on bit-line 18 via negative feedback to produce a voltage at node 54 because this arrangement acts as an integrating circuit and the integrator is reset prior to each sensing operation by transistor 58 which balances the invertor 48, 50 within its high-gain operating region. Once the bit-line charge has been sensed in this manner and the voltage, as a result, has stabilised at node 54, the voltage is then sampled through a transmission gate formed by transistors 60, 62 onto a capacitor 64 where it is stored temporarily. Under the control of read-out signal 66 acting through transistor 68 the voltage stored in capacitor 64 is connected to read-out line 26 and then to the second amplifier stage 36.

Amplifier stage 36 also operates in a charge sensing mode using the invertor provided by transistors 70, 72 which are connected in an identical manner to the transistors of invertor 46. Negative gain is also provided and a capacitor 74 integrates the charge of negative feed back and the transistor 76 serves to reset the integrator in the same way as transistor 58 of invertor 46, by balancing the transistors 70, 72 of the invertor prior to the output of each sample.

The operation of the circuitry shown in FIG. 2 will be best described with reference to also FIG. 3 of the drawings. In the timing waveforms for the operation of FIG. 2 the first part of the waveforms relates to the column sense amplifier 34 and the second part of the waveforms relates to the output of amplifier 36.

In operation the sense amplifier 34 is reset by turning on transistor 58 (FIG. 3a). Transistors 48 and 50 of invertor 46 balance to a potential to around VDD/2 and this potential is also driven on to the bit-line 18. The sense operation is enabled, as seen in FIG. 3b, by first turning off transistor 58 and then turning on transistor 42 via the word-line 14. Negative feedback in the sense amplifier maintains the bit-line potential by adjusting the potential across the capacitor 52 to source or sink charge as necessary. Thus the potential of the cell diode is brought to the balance potential as seen in FIG. 3c, and the transfer charge necessary to achieve this is provided by capacitor 52, which integrates the net charge movement and provides a residual potential at node 54 in proportion to the charge detected.

Once the invertor 46 has settled, the voltage on node 54 is sampled (FIG. 3d) by activating transistor 62 and the result is held on capacitor 64 as shown in FIG. 3e. The diode 40 within image sensing cell is then reset by forcing a high voltage on the bit line 18 via transistor 44 whilst the word-line 14 is still activated (FIG. 3f). The word line 14 is then turned off trapping the reset value on diode 40 and enabling it to recommence integration. Thus the sense amplifier 32 is then ready to commence its operational cycle. Within each cycle, the value stored on the capacitor 64 is scanned out and the information in the vertical shift register is shifted by one row to enable the sense operation to commence again at the next row in the array.

The value on capacitor 64 is scanned out under the control of read-out transistor 68 to output amplifier 36. As with invertor 46, the transistors 70, 72 balance to a potential of around Vdd/2 (FIG. 3g). The sense operation is enabled in the same way by turning off transistor 76 and turning on transistor 68 (FIG. 3h). Negative feedback results in the potential being adjusted across the capacitor 74 so that the potential across amplifier is brought to the balance potential (FIG. 3i). Capacitor 74 integrates the charge to provide an output potential at node 77 in the same way as with sense amplifier 34. The potential at node 77 is the output corresponding to the initial charge on the cell 32.

It will be appreciated that using a contemporary two-micron CMOS process the sense amplifiers 34 perform charge detection and produce a steady output voltage within approximately 6 micro-seconds with a Vdd supply of 5 volts and a signal range at the output of the sense amplifier in the range 1.5 to 3.5 volts. The gain of the sense amplifier 34 is controlled by the value of the feedback capacitor 52. If the gain of the invertor amplifier 46 is sufficiently high then the gain of the whole sense amplifier 34 depends to first order only on the value of the feed back capacitor 52. Under this assumption $$\Delta V_{out} = \frac{\Delta Q}{C_x}$$

where ΔQ is the change in bit-line charge caused by opening the cell access transistor.

The circuit hereinbefore described is reasonably immune to column-to-column variations in sensitivity because the dominant gain factor is provided by capacitor 52 and this can be well matched between columns within one chip, although its absolute value may vary significantly between chips. The other predominant source of variation is caused by differences in the invertor amplifier characteristics, and especially threshhold variations in transistors 48 and 50, which affect the balance potential. These variations can of the order of several millivolts typically and their effect is minimised by using the largest practical voltage range of node 54.

It will be appreciated that various modifications may be made to the embodiment hereinbefore described without departing from the scope of the invention. Within the column sense amplifier automatic gain control may be used to improve black image quality and the capacitor 52 need not be a single capacitor. Several values of the capacitor 52 could be provided during manufacture and then the appropriate value of the capacitor selected for performing charge integration for that particular amplifier. These values of capacitors would differ by discrete amounts. This could also be applicable to the capacitor 74 in amplifier 36. It will also be appreciated that the outputs of amplifiers 20 may be processed in parallel instead of serially as herinbefore described.

FIGS. 4a–e depict alternative forms of invertor for use with the column sense amplifiers for different technologies; invertors for CMOS, nMOS, Bipolar and BiMOS are shown as is the operational amplifier which could also be used.

An advantage of the present arrangement is that the circuitry is able to be implemented within a restricted cell pitch and performs successful preliminary charge sensing as close as practicable to the cell site. Furthermore the power and area is kept low in the part of the design that is repeated many times and the problem of amplifying mismatching due to process variations has been minimised. A further advantage of the described embodiment is that only those components available in common CMOS technology are used and the circuits operate within the normal breakdown potential of this technology, with a nominal supply voltage at or around 5 volts.

In addition, when the array sensors are realised in this technology, further system functions can be designed and integrated on the same silicon chip.

I claim:

1. An integrated circuit for use as an image array sensor and providing an output signal to an off-circuit read device, said integrated circuit comprising,
    a two-dimensional matrix array of sensing cells having a plurality of cell columns and a plurality of cell rows, each sensing cell having a photodiode and a transistor for reading from and writing to the photodiode, horizontal scan means coupled to each cell in the array for scanning each cell row of the array of sensing cells, vertical scan means coupled to each cell in the array for scanning each cell column of said array of sensing cells, a plurality of analogue switch means each connected between at least one of said cell columns and the horizontal scan means for receiving image data from said cells, each of said analogue switch means being also connected by a common conductor to an output amplifier forming the output of the integrated circuit, each of said plurality of analogue switch means includes voltage storage means and first charge sensing amplifier means which provides a preliminary detection of charge created on each cell in response to radiation impinging thereon by converting the detected charge to a voltage using a first charge integrating circuit and capacitively storing the voltage in said voltage storage means, in the form of a charge corresponding to the cell charge, and that said output amplifier comprises a second charge sensing amplifier means which is selectively coupled to said voltage storage means of said analogue switch means, for providing an output signal to the off-circuit read device, said output signal being a voltage proportional to the charge in said voltage storage means.

2. An integrated circuit as claimed in claim 1 further characterized in that the sensing cell being "read" is reset using a signal from the vertical scan means and signals generated off-circuit of the array whilst said sensing cell is isolated from the signal stored in the voltage storage means.

3. An integrated circuit as claimed in claim 1 wherein the second charge sensing amplifier means is a second charge integrating circuit.

4. An integrated circuit as claimed in claim 1 wherein the first charge integrating circuit comprises an inverter consisting of two transistors arranged to provide negative gain and at least one capacitor located between input and output terminals of the inverter to provide charge integration via negative feedback to provide a voltage at the output of the invertor.

5. An integrated circuit as claimed in claim 1 wherein the first charge integrating circuit comprises an inverter consisting of, one transistor and one resistor, or an operational amplifier arranged to provide negative gain and at least one capacitor located between input and output terminals of the inverter to provide charge integration via negative feedback to provide a voltage at the output of the inverter.

6. An integrated circuit as claimed in claim 1 wherein the integrated circuit is fabricated using a technology selected from the group consisting of CMOS, PMOS, NMOS, Bipolar, BiMOS, BiCMOS and amorphous silicon technologies.

7. A camera having an electronic image capture means which includes a two-dimensional matrix array sensor, wherein said matrix array sensor comprises an integrated circuit according to claim 1.

8. A method of detecting radiation incident upon an image sensor fabricated using integrated circuit technology in which the integrated circuit comprises a two dimensional matrix array of image sensing cells having a plurality of cell columns and a plurality of cell rows, each image sensing cell having a photodiode and a transistor for reading to and writing from the photodiode, horizontal scan means coupled to each cell in the array for scanning each cell row in the array, vertical scan means coupled to each cell in the array for scanning each cell column in the array, and a plurality of analogue switch means each connected between at least one of the cell columns and said horizontal scan means for receiving image data from each of said cells, each of said plurality of analogue switch means includes voltage storage means and first charge sensing amplifier means, each of said analogue switch means being also connected by a conductor to a output amplifier having its output connected to an external read-device for reading image signals from said output amplifier, said method being characterized by the steps of:

reading a cell from an associated one of said cell columns using a selected one of the plurality of analogue switch means by generating a voltage to balance charge in the cell created in response to incident radiation, storing the voltage capacitively in the selected one of the plurality of analogue switch means in the form in the form of a charge corresponding to the cell charge, and reading out the capacitively stored information in the selected one of the plurality of analogue switch means to the output amplifier.

9. A method as claimed in claim 8 further including the steps following said storing step of isolating the cell from the capacitively stored voltage using a switch which is actuated in response to off-circuit signals; followed by, reseting the cell by a combination of signals from the horizontal scan means and off-circuit signals.

10. An integrated circuit according to claim 1 wherein said integrated circuit is implemented using a technology selected from CMOS, PMOS, NMOS, Bipolar, BiMOS and BiCMOS technologies.

11. An integrated circuit according to claim 10 wherein said integrated circuit is implemented using a technology selected from CMOS and BiCMOS technologies.

12. An integrated circuit according to claim 10 wherein said two-dimensional matrix array of sensing cells has a small cell pitch of less than about 20 microns.

13. An integrated circuit according to claim 1 wherein each of said plurality of analogue switch means is connected to only one of said cell columns.

14. An integrated circuit according to claim 13 wherein each of said plurality of analogue switch means is located adjacent its associated cell column.

15. An integrated circuit according to claim 1 wherein said first charge sensing amplifier includes an inverter.

16. An integrated circuit according to claim 1 wherein said first charge integrating circuit comprises an inverter means for generating a voltage to balance said charge created on each cell.

17. An integrated circuit according to claim 1 wherein said first charge integrating circuit includes two transistors.

18. An integrated circuit according to claim 1 further including a plurality of switches, each of said switches connecting at least on of said voltage storage means to said output amplifier.

19. An integrated circuit image array sensor comprising:

a two-dimensional matrix array of sensing cells having a plurality of cell columns and a plurality of cell rows, each of said sensing cells in said two-dimensional matrix array having a photodiode and a transistor for reading from and writing to the photodiode, each of said sensing cells in said two-dimensional matrix array generating a charge in response to radiation impinging on said cell to provide image data;

horizontal scan means coupled to each cell in said two-dimensional matrix array for scanning each cell row of the array of sensing cells;

vertical scan means coupled to each cell in said two-dimensional matrix array for scanning each cell column of said array of sensing cells;

a plurality of analogue switch means each connected between at least one of said cell columns and said horizontal scan means for receiving said image data from said cells, each of said analogue switch means including charge sensing amplifier means for converting said charge to a voltage by integrating said charge and further including a voltage storage means for capacitively storing said voltage; and an output amplifier which is selectively connected to each of said voltage storage means.

20. An integrated circuit for use as an image array sensor and providing an output signal to an off-circuit read device, said integrated circuit comprising, a two-dimensional matrix array of sensing cells having a plurality of cell columns and a plurality of cell rows, each sensing cell having a photodiode and a transistor for reading from and writing to the photodiode, horizontal scan means coupled to each cell in the array for scanning each cell row of the array of sensing cells, vertical scan means coupled to each cell in the array for scanning each cell column of said array of sensing cells, a plurality of analogue switch means each connected between at least one of said cell columns and the horizontal scan means for receiving image data from said cells, each of said analogue switch means being also connected by a common conductor to a output amplifier forming the output of the integrated circuit, each of said plurality of analogue switch means includes voltage storage means and first charge sensing amplifier means which provides a preliminary detection of charge created on each cell in response to radiation impinging thereon by converting the detected charge to a voltage using a first charge integrating circuit, said first charge integrating circuit comprising an inverter means for generating a voltage to balance said charge created on each cell, and capacitively storing the voltage in said voltage storage means, in the form of a charge corresponding to the cell charge, and that said output amplifier comprises a second charge sensing amplifier means which is selectively coupled to said voltage storage means of said analogue switch means, for providing an output signal to the off-circuit read device, said output signal being a voltage proportional to the charge in said voltage storage means.

* * * * *

UNITED STATES PATENT AND TRADEMARK OFFICE
CERTIFICATE OF CORRECTION

PATENT NO. : 5,345,266
DATED : September 6, 1994
INVENTOR(S) : Peter B. Denyer

It is certified that error appears in the above-indentified patent and that said Letters Patent is hereby corrected as shown below:

On the title page: Item[56]

References Cited - U.S. Patent Documents - "4,310,477" should be -- 4,301,477 --.

Foreign Patent Documents - "WO83/03730 4/1983" should be -- WO83/03730 4/1983 Japan --.

Signed and Sealed this

Thirty-first Day of January, 1995

Attest:

BRUCE LEHMAN

Attesting Officer    Commissioner of Patents and Trademarks